(12) United States Patent
Fu et al.

(10) Patent No.: US 11,152,255 B2
(45) Date of Patent: Oct. 19, 2021

(54) METHODS OF PERFORMING CHEMICAL-MECHANICAL POLISHING PROCESS IN SEMICONDUCTOR DEVICES

(71) Applicant: Taiwan Semiconductor Manufacturing Co., Ltd., Hsin-Chu (TW)

(72) Inventors: Shih-Kang Fu, Taoyuan County (TW); Ming-Han Lee, Taipei (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 7 days.

(21) Appl. No.: 16/712,430

(22) Filed: Dec. 12, 2019

(65) Prior Publication Data
US 2020/0312708 A1    Oct. 1, 2020

Related U.S. Application Data

(60) Provisional application No. 62/825,599, filed on Mar. 28, 2019.

(51) Int. Cl.
*H01L 21/768* (2006.01)
*H01L 21/321* (2006.01)
(Continued)

(52) U.S. Cl.
CPC ...... *H01L 21/7684* (2013.01); *H01L 21/3212* (2013.01); *H01L 21/76805* (2013.01); *H01L 21/76829* (2013.01); *H01L 21/76832* (2013.01); *H01L 21/76841* (2013.01); *H01L 21/76843* (2013.01); *H01L 21/76895* (2013.01); *H01L 23/535* (2013.01); *H01L 23/53209* (2013.01); *H01L 23/53223* (2013.01); *H01L 23/53238* (2013.01); *H01L 23/53252* (2013.01)

(58) Field of Classification Search
CPC .......... H01L 21/7684; H01L 21/76819; H01L 21/3212; H01L 21/32115; H01L 21/76832; H01L 21/76835; H01L 21/76837; H01L 21/76829; H01L 21/76841; H01L 21/76843; H01L 21/7685; H01L 21/76805; H01L 21/76807; H01L 21/76847
See application file for complete search history.

(56) References Cited

U.S. PATENT DOCUMENTS 8,828,875 B1 * 9/2014 Lu ..................... H01L 21/31055
438/690

* cited by examiner

*Primary Examiner* — Thanhha S Pham
(74) *Attorney, Agent, or Firm* — Haynes and Boone, LLP

(57) ABSTRACT

A method of forming a semiconductor structure includes removing a top portion of a conductive feature disposed in a first dielectric layer and over a semiconductor substrate to form a first recess, depositing a second dielectric layer over the first dielectric layer, where the second dielectric layer includes a first region disposed vertically above the first recess and a second region disposed adjacent the first region, and forming a third dielectric layer over the second dielectric layer. The method further includes subsequently forming openings in the third dielectric layer that extend to expose the second dielectric layer, depositing a conductive material in the openings, and planarizing the conductive material to form conductive features in the first and the second regions, where the planarizing completely removes portions of the third dielectric layer disposed in the second region.

20 Claims, 8 Drawing Sheets

(51) Int. Cl.
*H01L 23/535* (2006.01)
*H01L 23/532* (2006.01)

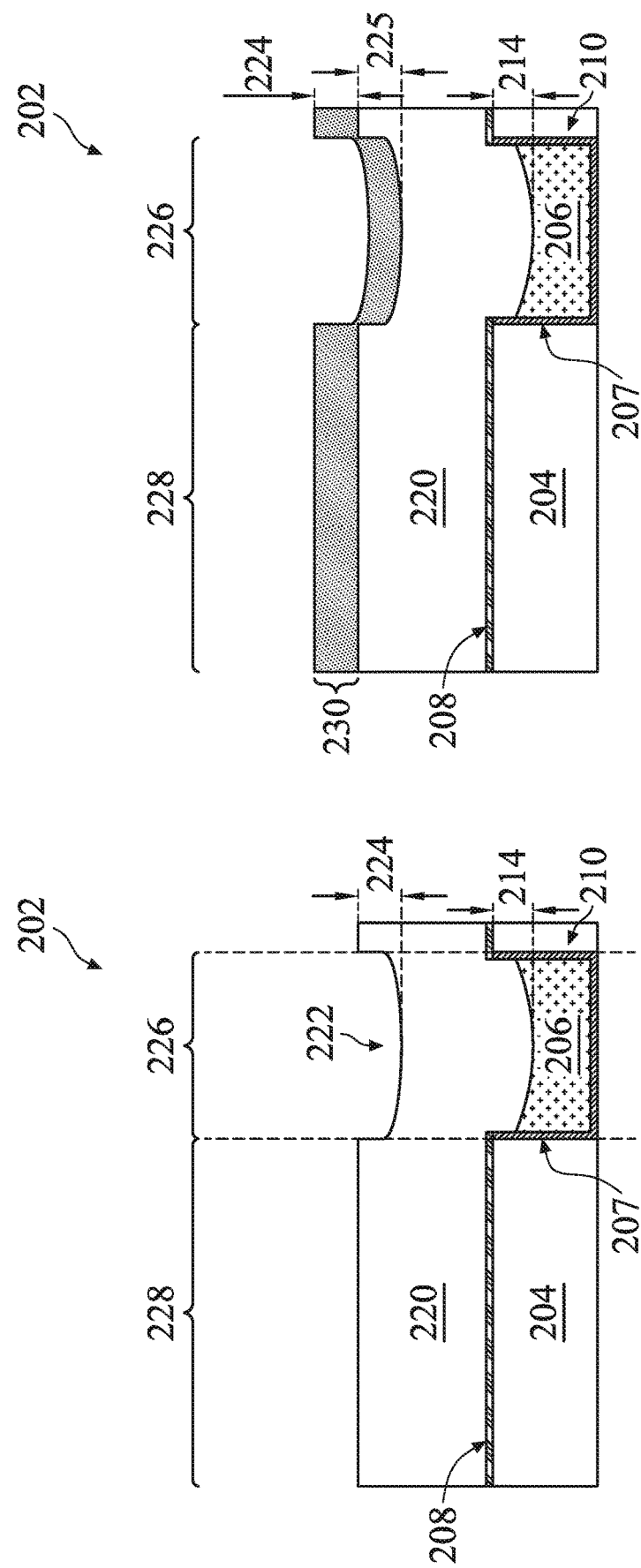

Oxidation: $M_a \rightarrow M_a^{n+} + ne^-$
Reduction: $M_b^{n+} + ne^- \rightarrow M_b$

METHODS OF PERFORMING CHEMICAL-MECHANICAL POLISHING PROCESS IN SEMICONDUCTOR DEVICES

CROSS-REFERENCE TO RELATED APPLICATIONS

This is a non-provisional application of and claims priority to U.S. Provisional Patent Application Ser. No. 62/825,599, filed on Mar. 28, 2019, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased.

Though advancements in processing ICs at reduced length scales have generally been adequate, they have not been satisfactory in all aspects. For example, in instances where devices of different densities are needed in nearby regions, challenges arise in terms of performing fabrication processes that would accommodate varying device characteristics. Specifically, devices with higher densities (i.e., located in closer proximity) may suffer inadvertent shortcomings when subjected to a chemical mechanical polishing/planarization (CMP) process that utilizes an oxidizing slurry to remove one or more materials. Accordingly, for at least this reason, improvements in methods of implementing CMP processes are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5A, 5B, 6, 7, 8, 9, 10, 11, 12, and 13 illustrate cross-sectional views of an embodiment of a semiconductor device at various stages of the method depicted in FIG. 1 according to one or more aspects of the present disclosure.

DETAILED DESCRIPTION

Figure 1:
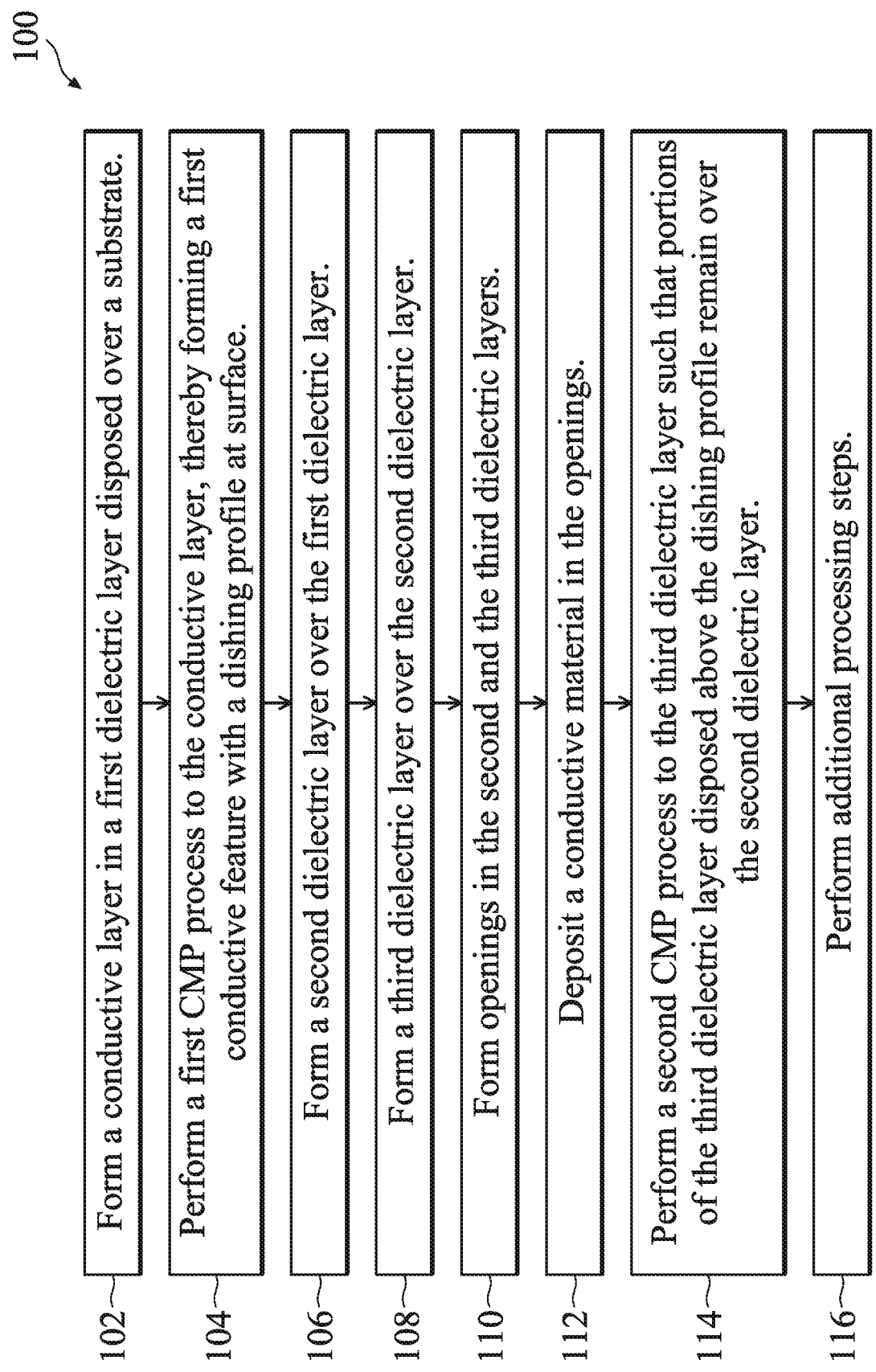
FIG. 1 is a flow chart of a method of fabricating a semiconductor device according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

It is noted that the present disclosure is directed to embodiments of chemical mechanical polishing/planarizing (CMP) processes useful for the fabrication of planar, multi-gate, gate-all-around (GAA), Omega-gate (Ω-gate), or Pi-gate (Π-gate) devices. In some embodiments, such a device may include a p-type metal-oxide-semiconductor (PMOS) device and/or an n-type metal-oxide-semiconductor (NMOS) device. In one example, the present disclosure is directed to a FinFET device. Embodiments of the present disclosure may be equally applicable to fabrication of other devices not discussed above.

During a CMP process, a surface of a substrate is acted upon by a slurry and a polishing pad. For example, a force may be applied to press the substrate against the pad while the substrate and the pad are rotated. The rotation and the substrate-to-pad force, in conjunction with the slurry supplied to the substrate, serve to remove substrate material and thus planarize the surface of the substrate. Generally, the CMP slurry may include at least an oxidant to oxidize the material on the surface to be removed, as well as an abrasive to mechanically remove the oxidized material. In many instances, the oxidant, such as hydrogen peroxide, oxidizes one or more materials (e.g., conductive materials) at the surface of the substrate to allow greater ease of CMP removal. However, at reduced length scale, interaction between the oxidant and materials to be polished may lead to inadvertent shortcomings affecting the reliability of the resulting device. Therefore, for these and other reasons, improvements in CMP slurries are desirable in fabricating semiconductor devices.

FIG. 1 illustrates a method 100 of a semiconductor fabrication process in accordance with one or more of the embodiments described herein. It is understood that the method 100 may include additional steps performed before, after, and/or during the method 100. It is also understood that the process steps of method 100 are merely examples and are not intended to be limiting beyond what is specifically recited in the claims that follow.

FIGS. 2-13 are cross-sectional views of an embodiment of a semiconductor device 200 during various stages of an embodiment of the method 100. It is understood that the semiconductor device 200 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the embodiments of the present disclosure. In some embodiments, the semiconductor device 200 includes a plurality of semiconductor devices (e.g., transistors), including PFETs, NFETs, etc., which may be interconnected. Moreover, it is noted that the process steps of the method 100, including any descriptions given with reference to FIGS. 2-13, are merely examples and are not intended to be limiting beyond what is specifically recited in the claims that follow.

Figure 2:
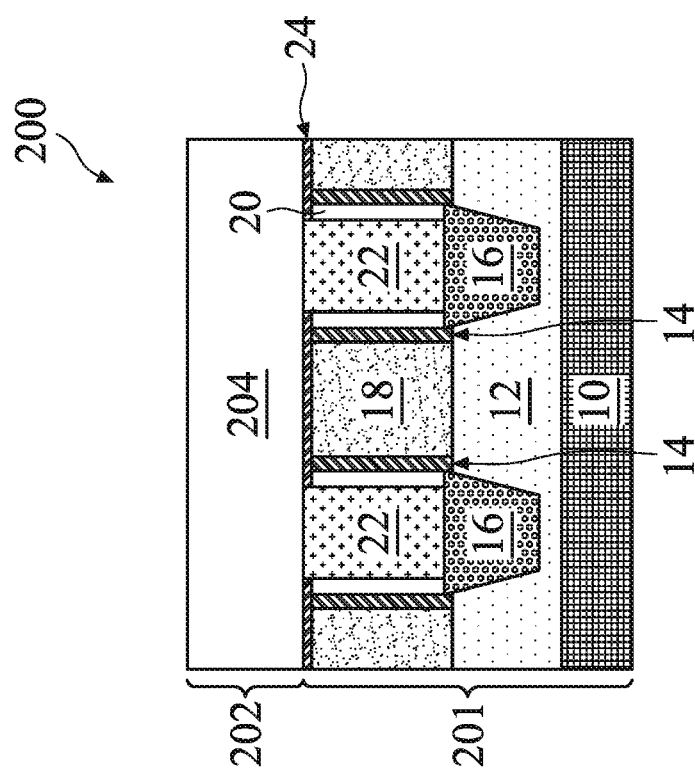

Referring to FIGS. 1 and 2, the method 100 begins at block 102 where THE device 200 is provided that includes a structure 202 formed over a structure 201. In some embodiments, the structure 201 may include a number of different components that form a front-end-of-line (FEOL) and/or middle-end-of-line (MEOL) portions of the device 200 (e.g., a MOSFET), while the structure 202 may be an interconnect structure (e.g., vertical interconnect structures such as vias or horizontal interconnect structures such as conductive lines). Alternatively or additionally, the structure 201 may be an interconnect structure similar to structure 202. It is understood that structure 202 and the structure 201 are not limited in their specific structures and functions within the device 200 so long as they maintain their relative spatial arrangement as discussed herein. Therefore, for purposes of simplicity the present disclosure is directed to embodiments in which the structure 201 includes FEOL and MEOL components and the structure 202 includes an interconnect structure formed over the structure 201.

Still referring to FIG. 2, the structure 201 includes an active region 12 disposed over a semiconductor substrate (hereafter referred to as "substrate") 10 and separated by isolation regions (not depicted). In some embodiments, the substrate 10 may be a semiconductor substrate such as a silicon substrate. The substrate 10 may include various layers, including conductive or insulating layers formed thereon. The substrate 10 may include various doping configurations depending on various design requirements. The substrate 10 may also include other semiconductors such as germanium, silicon carbon (SiC), silicon germanium (SiGe), or diamond. Alternatively, the substrate 10 may include a compound semiconductor and/or an alloy semiconductor. Further, the substrate 10 may optionally include an epitaxial layer (epi-layer), may be strained for performance enhancement, may include a silicon-on-insulator (SOI) structure, and/or have other suitable enhancement features. The isolation regions may include silicon oxide, silicon nitride, silicon oxynitride, fluoride-doped silicate glass (FSG), a low-k dielectric material, and/or other suitable materials. In many embodiments, the isolation regions include shallow trench isolation (STI) features.

In some embodiments, the active region 12 includes a plurality of fins extending away from a top surface of the substrate 10. As such, the active region 12 is said to provide at least one FinFET, and FIGS. 2-13 illustrate cross-sectional views of the device 200 along a lengthwise direction of the fin. Alternatively, the active region 12 may provide planar FETs. The active region 12 may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The active region 12 may be doped with an n-type dopant or a p-type dopant for forming p-type FET and n-type FET, respectively. If including fins, the active region 12 may be formed using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The device 200 further includes source/drain (S/D) features 16 disposed in the active region 12, a metal gate stack 18 disposed adjacent the S/D features 16, and S/D contacts 22 disposed over the S/D features 16 and in an interlayer dielectric (ILD) layer 20. In many embodiments, the S/D features 16 may be suitable for a p-type FET device (e.g., a p-type epitaxial material) or alternatively, an n-type FET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. The S/D features 16 may be formed by any suitable techniques, such as etching processes followed by one or more epitaxy processes.

Though not depicted, the metal gate stack 18 may include a plurality of material layers, such as a high-k dielectric layer and a gate electrode disposed over the high-k dielectric layer. The metal gate stack 18 may further include other material layers, such as an interfacial layer, barrier layers, hard mask layers, other suitable layers, or combinations thereof. The high-k dielectric layer may include a dielectric material having a high dielectric constant, for example, greater than that of thermal silicon oxide (~3.9). In one example, the high-k dielectric layer may include a high-K dielectric layer such as hafnium oxide ($HfO_2$). The gate electrode may include at least one work-function metal (WFM) layer and a bulk conductive layer. The gate electrode may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. Various layers of the metal gate stack 18 may be formed by any suitable method, such as chemical oxidation, thermal oxidation, atomic layer deposition (ALD), chemical vapor deposition (CVD), physical vapor deposition (PVD), plating, other suitable methods, or combinations thereof. A polishing process (e.g., CMP) may be performed to remove excess materials from a top surface of the metal gate stack to planarize a top surface of the metal gate stack 18.

In various embodiments, the device 200 further includes gate spacers 14 disposed on sidewalls of the metal gate stacks 18. The gate spacers 14 may include a dielectric material, such as silicon oxide, silicon nitride, silicon carbide, silicon oxynitride, other suitable dielectric materials, or combinations thereof. The gate spacers 14 may be formed by first depositing a blanket of spacer material over the device 200, and then performing an anisotropic etching process to remove portions of the spacer material to form the gate spacers 14 on the sidewalls of the metal gate stacks 18.

In many embodiments, the metal gate stacks 18 are formed after other components of the device 200 (e.g., the S/D features 16) are fabricated. Such process is generally referred to as a gate replacement process, which includes forming dummy gate structures (not depicted) as placeholders for the metal gate stacks 18, forming the S/D features 16, forming the ILD layer 20 (and optionally an etch-stop layer, or ESL, such as ESL 24) over the dummy gate structures and the S/D features 16, planarizing the ILD layer 20 by, for example, a CMP process, to expose a top surface of the dummy gate structures, removing the dummy gate structures in the ILD layer 20 to form trenches in the active region 12, and forming the metal gate stacks 18 in the trenches to complete the gate replacement process. In some embodiments, the ILD layer 20 includes a porous low-k dielectric material (e.g., doped silicon oxide), fluoride-doped silicate glass (FSG), phosphosilicate glass (PSG), borophosphosilicate glass (BPSG), other suitable dielectric materials, or combinations thereof. In the depicted embodiment, the ILD layer 20 includes a porous low-k dielectric material, which is understood to be a dielectric material having a dielectric constant less than that of silicon oxide. In an example embodiment, the ILD layer 20 includes porous carbon-doped silicon oxide with a porosity of about 1% to about 8% and a dielectric constant of about 1 to about 3.5. It is noted that a porosity of less than about 1% may compromise the quality of the ILD layer 20 as an insulating component of the device 200 (e.g., having a greater-than-desired dielectric constant), while a porosity of greater than about 8% may compromise the structural integrity of the ILD layer 20 (e.g., causing inadvertent collapsing during subsequent process steps). The ILD layer 20 may include a multi-layer structure having multiple dielectric materials and may be formed by a deposition process such as, for example, CVD, flowable CVD (FCVD), spin-on-glass (SOG), other suitable methods, or combinations thereof. The ESL 24 may comprise silicon carbide, aluminum oxide, aluminum oxynitride, dense carbon-doped silicon oxide (porosity of approximately 0%), silicon nitride, silicon oxynitride, silicon nitride with oxygen or carbon elements, other suitable materials, or combinations thereof, and may be formed by CVD, PVD, ALD, other suitable methods, or combinations thereof.

The device 200 further includes S/D contacts 22 disposed in the ILD layer 20 and physically contacting the S/D features 16. The S/D contacts 22 are configured to connect the S/D features 16 with subsequently formed interconnect structures, such as vias and conductive lines (e.g., the structure 202 as discussed above), over the device 200. In many embodiments, the S/D contacts 22 includes a conductive material such as Cu, W, Ru, Mo, Al, Co, Ni, Mn, Ag, other suitable conductive materials, or combinations thereof. The S/D contacts 22 may be formed by first patterning the ILD layer 20 (and the ESL 24) to form trenches (not depicted) to expose the S/D features 16, and depositing the conductive material by CVD, PVD, ALD, plating, other suitable methods, or combinations thereof to form the S/D contacts 22. The patterning of the ILD layer 20 may include forming a masking element (not depicted) over the ILD layer 20, where the masking element includes a lithographic resist material (e.g., a photoresist layer) configured to undergo chemical changes when exposed to a radiation source (e.g., an extreme ultraviolet, or EUV, source) through a lithographic mask or reticle. After being subjected to radiation exposure, the masking element may then be developed (followed by an optional baking process) to transfer the pattern on the lithography mask onto the masking element. The patterned masking element may then be used as an etch mask to form an opening in the ILD layer 20, after which the patterned masking element is removed by any suitable method such as wet etching or plasma ashing. Thereafter, a conductive material including Cu, W, Ru, Mo, Al, Co, Ni, Mn, Ag, other suitable conductive materials, or combinations thereof is deposited in the opening by any suitable method, such as CVD or plating, followed by one or more CMP process to form the S/D contacts 22.

As depicted in FIG. 2, the structure 202 includes an ILD layer 204 disposed over the structure 201. In many embodiments, the ILD layer 204 is substantially similar to the ILD layer 20 in composition and may be formed by any suitable method as discussed above. For example, the ILD layer 204 includes a porous low-k dielectric material such as carbon-doped silicon oxide having a porosity of about 1% to about 8%. In some examples, the structure 202 may further include an ESL substantially similar to the ESL 24 deposited over the ILD layer 204.

Figure 3:
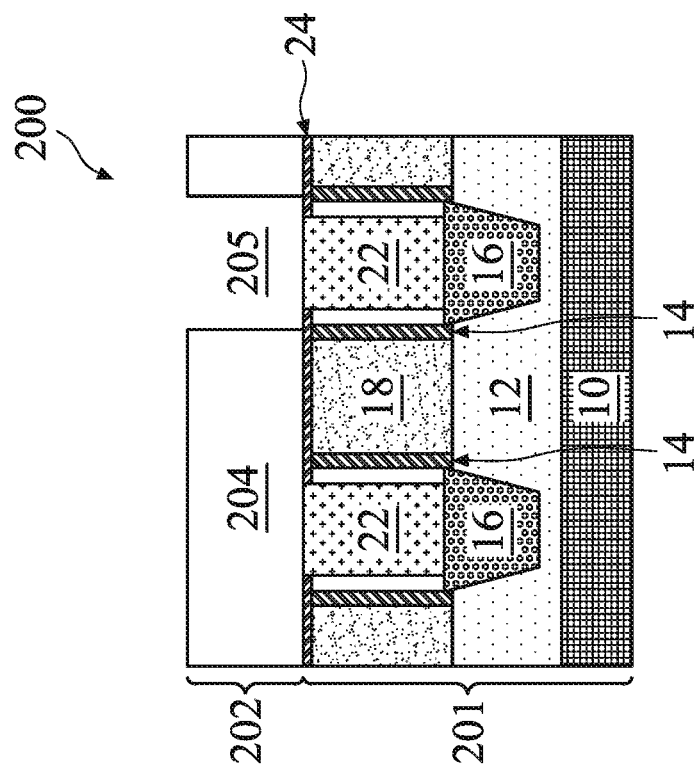

Referring to FIG. 3, the method 100 at block 102 forms an opening 205 in the ILD layer 204. In many embodiments, the opening 205 exposes a top surface of one of the S/D contacts 22. The opening 205 may be formed by a series of patterning and etching processes similar to the processes discussed in detail above with respect to forming the S/D contacts 22. Subsequently, referring to FIG. 4, the method 100 at block 102 deposits a conductive material 206 over the ILD layer 204, thereby filling the opening 205. The conductive material 206 may include any suitable material such as Cu, W, Ru, Mo, Al, Co, Ni, Mn, Ag, other suitable conductive materials, or combinations thereof. In some embodiments, a barrier layer 207 is first deposited in the opening 205 and over the ILD layer 204 before depositing the conductive material 206. The barrier layer 207 may include a nitride material such as titanium nitride, tantalum nitride, manganese nitride, other suitable materials, or combinations thereof, and may be deposited by CVD, ALD, PVD, other suitable deposition methods, or combinations thereof.

Figure 5A:
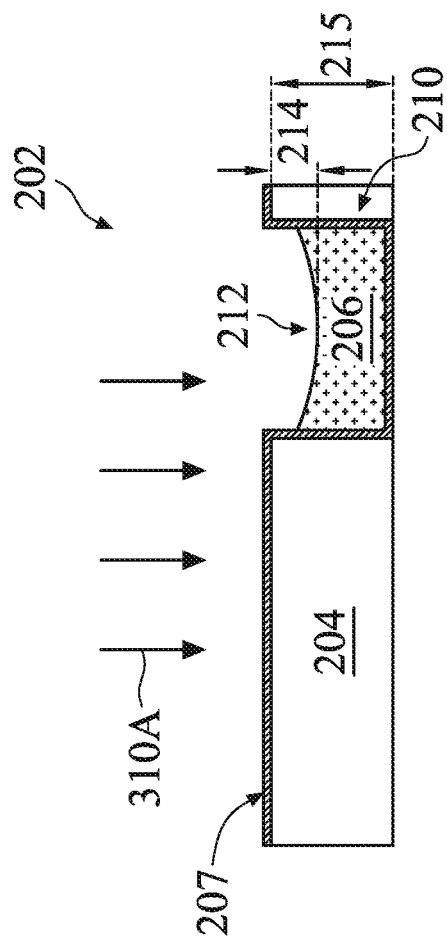
Figure 5B:
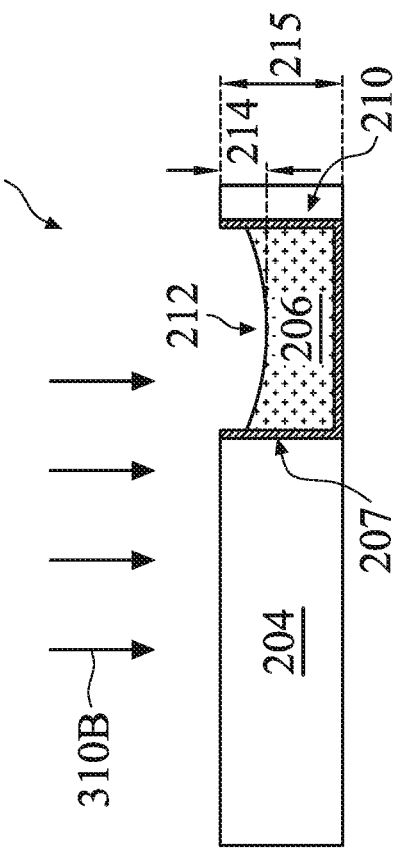
Figure 4:
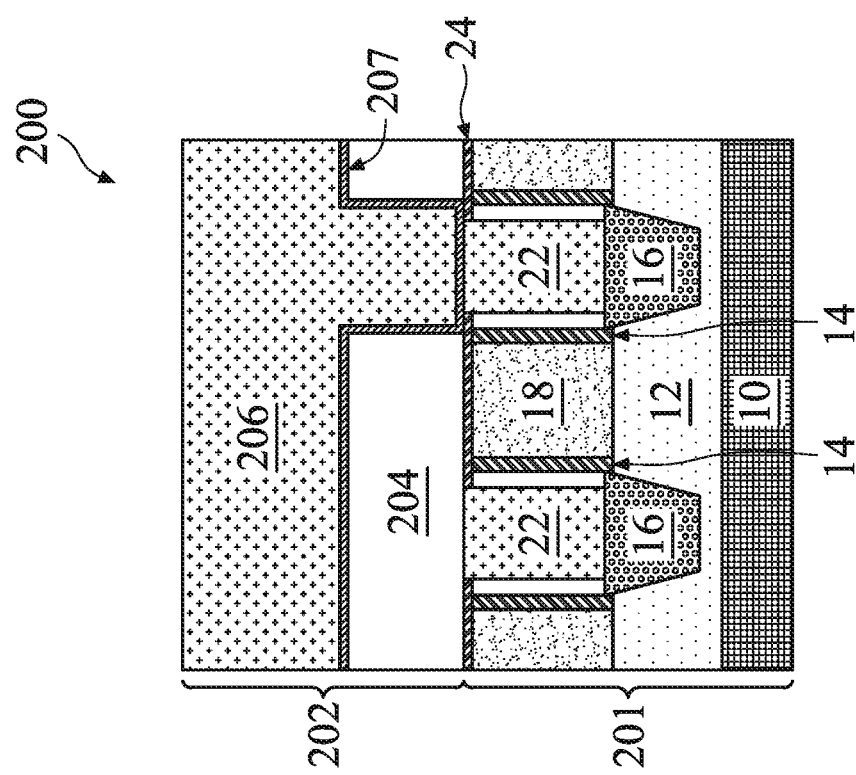

Referring to FIGS. 1, 5A, and 5B, the method 100 at block 104 performs a series of CMP processes to remove any excess conductive material 206 from a top surface of the ILD layer 204 and to form a conductive feature 210. Because the following discussion will be focused on additional processing steps applied to the structure 202, for purposes of simplicity only the structure 202 is depicted in FIG. 5A and all subsequent figures. In the present embodiments, the conductive feature 210 may include any suitable conductive component such as, for example, a via or a conductive line formed over the underlying structure 201 and configured to interconnect components such as S/D contacts 22 with subsequently formed back-end-of-line (BEOL) features in the device 200.

Notably, the series of CMP processes implemented at block 104 are configured to remove a portion of the conductive material 206 formed below the top surface of the ILD layer 204 such that a top surface of the conductive feature 210 is configured to have a dishing profile (or a recess) 212. In other words, instead of planarizing the top surface of the conductive feature 210, the CMP process 310 intentionally forms a recess (the dishing profile 212) in the conductive feature 210 such that its top surface is not leveled with the top surface of the rest of the structure 202 (e.g., the ILD layer 204). Stated yet another way, the CMP process 310 is tuned to remove portions of the conductive material 206 at a higher rate than its surrounding components.

In the present embodiments, the series of CMP processes include a CMP process 310A followed by a CMP process 310B. Referring to FIG. 5A, the CMP process 310A includes polishing away portions of the conductive material 206 formed over the ILD layer 204 (and the barrier layer 207) and subsequently polishing away a portion of the conductive material 206 below the top surface of the ILD layer 204 (and the barrier layer 207). While the removal of the conductive material 206 from above the top surface of the ILD layer 204 may be controlled by the duration of the polishing process, the formation of the dishing profile 212 may be controlled by actions of various chemical agents in a CMP slurry configured to tune the removal selectivity of one or more materials.

A CMP slurry generally includes at least an oxidant (e.g., $H_2O_2$, $KIO_4$, $NaIO_4$, $NaClO$, $KIO_3$, $KClO_4$, other suitable oxidants, or combinations thereof) and a plurality of abrasive particles (e.g., silicon oxide, cerium oxide, aluminum oxide, other suitable abrasive particles or combinations thereof). In the present embodiments, the CMP slurry may additionally include a pH buffering agent (e.g., KOH) to keep the pH of the CMP slurry at about 3 to about 11, and/or a chelating agent such as an organic acid (e.g., citric acid, oxalic acid, other suitable acids, or combinations thereof), a polymer (e.g., polyethylene glycol and derivatives thereof, other polymers, or combinations thereof), an amine (e.g., benzotriazole and derivatives thereof, other amines, or combinations thereof), an organic phosphoric acid having an alkyl group that includes 1-12 carbon atoms, other suitable chemical agents, or combinations thereof. As metal(s) in the conductive material 206 is oxidized by the oxidant to form metal ions, chelating agent(s) provided herein may facilitate the selective removal of the metal ions with respect to its surrounding materials such as the barrier layer 207 and/or the ILD layer 204. In some examples, organic acids are configured to enhance the removal rate of the conductive material 206, polyethylene glycol is configured to suppress removal of the ILD layer 204, and amines are configured to suppress the removal rate of the conductive material 206. In the present embodiments, the CMP process 310A selectively removes portions of the conductive material 206 without removing or substantially removing the barrier layer 207 and the ILD layer 204 from the structure 202. As such, the slurry utilized for the CMP process 310A may include relatively more organic acid for enhancing the removal rate of the conductive material 206. Accordingly, the slurry may be acidic in nature, i.e., having a pH value of about 3 to less than about 7. In some embodiments, the slurry utilized for the CMP process 310A may be free or substantially free of any amine.

Subsequently, referring to FIG. 5B, the CMP process 310B selectively removes the barrier layer 207 from the top surface of the ILD layer 204. The CMP process 310B may utilize one or more chemical agents different from those discussed above with respect to the CMP process 310A to provide a greater removal rate of the barrier layer 207 with respect to the conductive material 206 and/or the ILD layer 204. For example, the slurry utilized for the CMP process 310B may include less organic acid and polyethylene glycol (and/or derivatives thereof) than the slurry utilized for the CMP process 310A, and thus may be more basic (i.e., having a pH value of greater than about 7 to about 11).

In many embodiments, as depicted in FIGS. 5A and 5B, the dishing profile 212 is configured to be a convex shape having a depth 214 at its deepest portion. In some embodiments, a ratio of the depth 214 to a thickness 215 of the conductive feature 210 is about ⅓ to about ½. In some examples, the depth 214 is from about 150 Angstroms to about 200 Angstroms. As will be discussed in detail below, the dishing profile 212 is configured to create an uneven topography when additional interconnect structures are formed over the conductive feature 210. Accordingly, a depth that is less than about ⅓ of the thickness 215 would not be sufficient to form the desired topography during subsequent processing steps. On the other hand, a depth that is more than about ½ of the thickness 215 may damage the structural integrity of the conductive feature 210 and/or the underlying S/D contacts 22. Furthermore, the dishing profile 212 as provided herein is intentionally formed in the conductive feature 210, i.e., a top portion of the conductive feature 210 is deliberately removed by a selective CMP process, to arrive at a desired depth 214 for accommodating subsequent processing steps. Dishing profiles formed due to the planarizing of the conductive feature 210 would generally not provide depths at such ratios as those described above with respect to the ratios of the depth 214 to the thickness 215.

Referring to FIGS. 1 and 6, the method 100 at block 106 forms an ILD layer 220 over the ILD layer 204 and the conductive feature 210. In the depicted embodiments, the method 100 first forms an ESL layer 208 over the ILD layer 204 before forming the ILD layer 220. In the present embodiments, the ESL layer 208 is substantially similar to the ESL layer 24 provided herein. In many embodiments, the ILD layer 220, which includes two regions 226 and 228, is substantially similar to the ILD layers 20 and 204 in composition and is formed by any suitable method as discussed above. Notably, because the region 226 is disposed directly above (i.e., substantially vertically aligned with) the conductive feature 210, the region 226 also includes a dishing profile (or a recess) 222 that substantially conforms to the shape of the dishing profile 212 disposed in the top surface of the conductive feature 210. In other words, the dishing profile 212 causes the ILD layer 220 to have an uneven topography where a top surface of the region 228 is above a top surface of the region 226. In some embodiments, the dishing profile 222 is congruent or substantially congruent to the dishing profile 212 and has a depth 224 similar to the depth 214 as discussed above with reference to FIGS. 5A and 5B.

Referring to FIGS. 1 and 7, the method 100 at block 108 forms a dielectric layer 230 over the ILD layer 220 such that the dielectric layer 230 conforms to the shape of the dishing profile 222 in the region 226. As such, the dielectric layer 230 has an uneven topography substantially similar to that of the ILD layer 220 as depicted in FIG. 6. In some examples, a thickness 225 of the dielectric layer 230 is about 50 Angstroms to about 300 Angstroms; of course, the present disclosure is not limited to such dimensions. As depicted herein, a top surface of a portion of the dielectric layer 230 in the region 226 (i.e., in the recess 222) is lower than a top surface of a portion of the dielectric layer 230 in the region 228. In the present disclosure, such difference may be defined by the depth 224 of the dishing profile 222. For reasons that will be discussed in detail below, it is important to note that the dielectric layer 230 is distinctly different from the ILD layer 220 in composition and physical properties. For example, in the present embodiments, the ILD layer 220 is similar to the ILD layer 204 and includes a porous low-k dielectric material (with a dielectric constant less than that of silicon oxide and a porosity of about 1% to about 8%) as discussed above, while the dielectric layer 230 includes a dielectric material such as dense silicon oxide or doped silicon oxide (porosity of approximately 0%), silicon nitride, silicon carbonitride, other suitable materials, or combinations thereof. Notably, the ILD layer 220 has a greater porosity than the dielectric layer 230, which is substantially non-porous. In other words, the dielectric layer 230 has a higher density than the ILD layer 220. In many embodiments, the dielectric layer 230 is formed by a suitable method such as thermal oxidation, CVD, FCVD, ALD, PVD, other suitable methods, or combinations thereof to a thickness of about 50 Angstroms to about 300 Angstroms.

Figure 9:
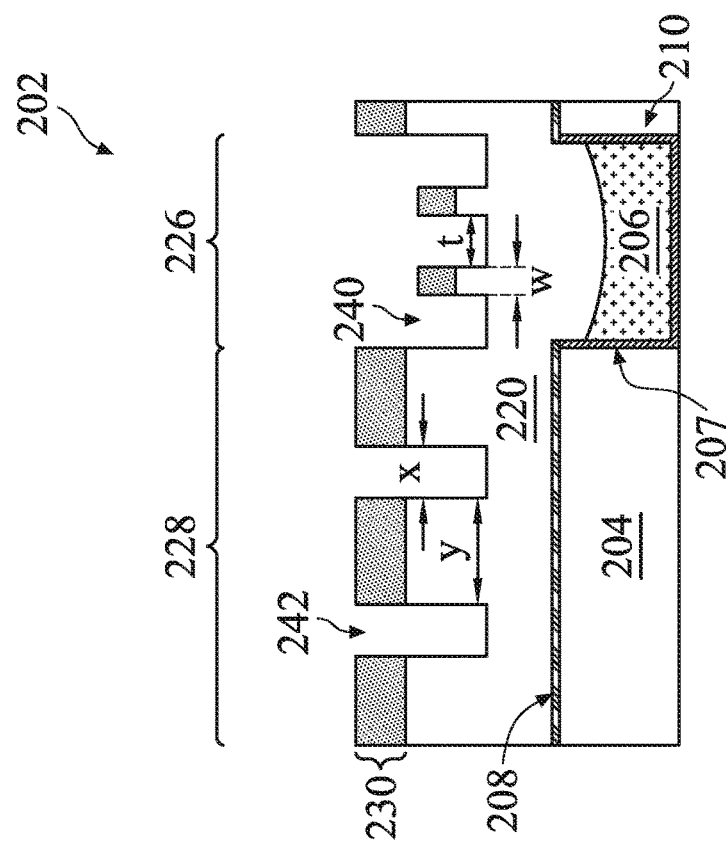
Figure 8:
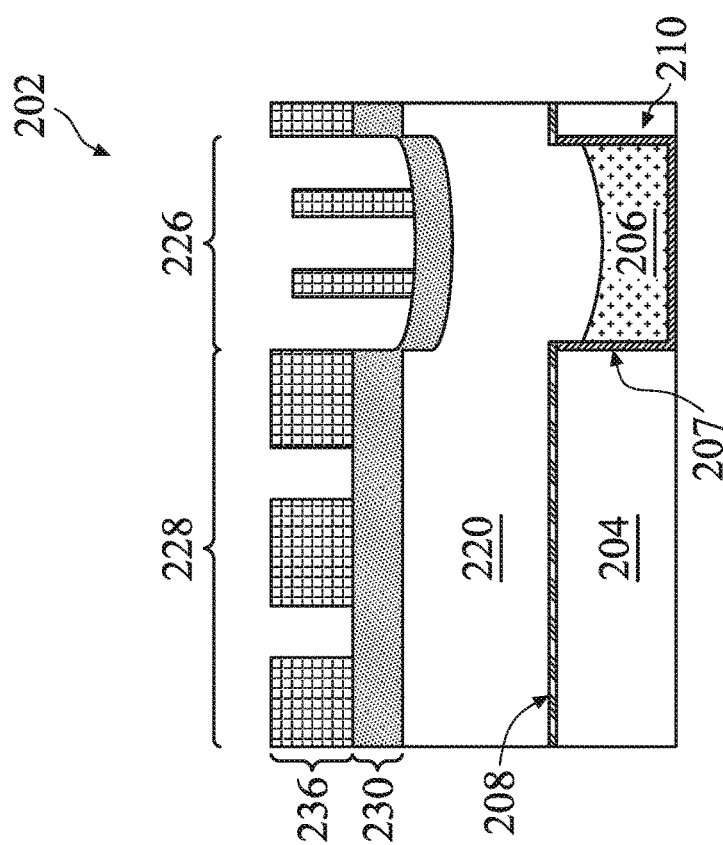

Referring to FIGS. 1, 8, and 9, the method 100 at block 110 forms multiple openings 240 and 242 in the ILD layer 220 (and the dielectric layer 230). In many embodiments, the method 100 forms the openings 240 and 242 via a series of patterning and etching processes similar to those discussed above with respect to forming the opening in the ILD layer 20. Briefly, a masking element including a lithographic resist material is disposed over the dielectric layer 230 and exposed to a radiation source through a lithographic mask. After a development process (and optionally a baking process), a patterned masking element 236 is formed as depicted in FIG. 8. Subsequently, referring to FIG. 9, the dielectric layer 230 and the ILD layer 220 are etched using the patterned masking element 236 as an etch mask, followed by the removal of the patterned masking element 236 by a suitable method such as wet etching or plasma ashing. In some embodiments, the openings 240 and 242 extend into the ILD layer 220 such that bottom surfaces of the openings 240 and 242 are below a bottom surface of the dielectric layer 230. In some embodiments, the dielectric layer 230 and the ILD layer 220 may be etched separately in a two-step process that includes first applying a dry etching process following by a wet etching process. The dry etching process may be implemented using any suitable etchant such as a (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, an oxygen-containing gas (e.g., $O_2$), a nitrogen-containing gas (e.g., $N_2$), a helium-containing gas, an-argon containing gas, a neon-containing gas, other suitable gases, or combinations thereof. The wet etching process may be implemented using any suitable etchant such as HF. It is understood that the present disclosure is not limited to the number of openings depicted herein so long as openings are formed in both the regions 226 and 228.

Still referring to FIG. 9, the openings 240 are disposed in the region 226, i.e., in the recess 222, while the openings 242 are disposed in the region 228. In other words, the openings 240 are disposed directly over, i.e., vertically above, the conductive feature 210. In the present disclosure, each of the openings 240 may be defined by a ratio of width t of the opening to spacing w between adjacent openings 240 in the region 226. Similarly, each of the openings 242 may be defined by a ratio of width x of the opening to spacing y between adjacent openings 242 in the region 228. In the present embodiments, the ratio t/w is greater than the ratio x/y, indicating that the density of the openings 240 in the region 226 is greater than the density of the openings 242 in the region 228. In some examples, the ratio t/w is approximately 1, while the ratio of x/y is less than 0.5. In some examples, the width t measures from about 15 nm to about 50 nm, and the width x measures from about 15 nm to about 500 nm. Of course, the present disclosure is not limited to these dimensions and ratios so long as the ratio of t/w is greater than the ratio of x/y as discussed above.

Figure 10:
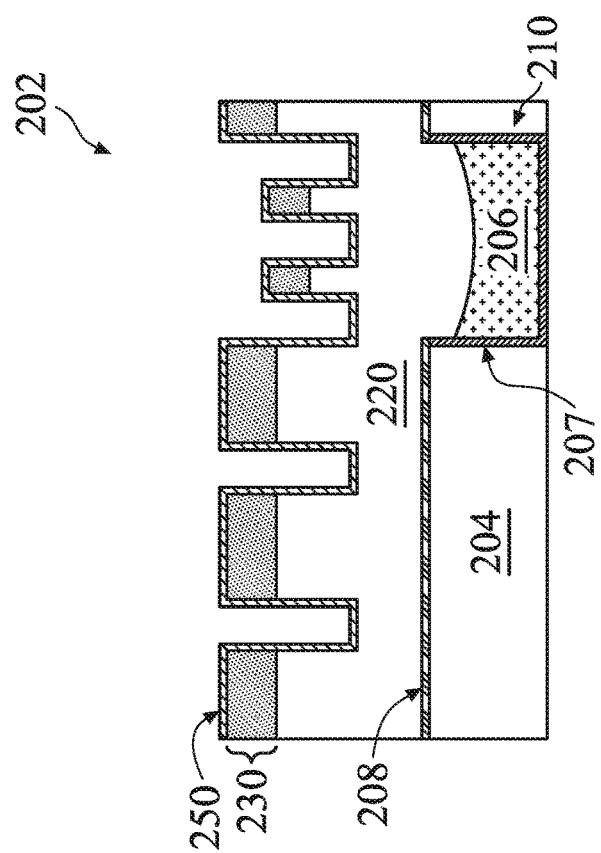

Referring to FIGS. 1 and 10-12, the method 100 at block 112 deposits a conductive material in the openings 240 and 242. Referring to FIG. 10, the method 100 conformally forms a barrier layer 250 over the dielectric layer 230 and portions of the ILD layer 220 in the openings 240 and 242. In many embodiments, the barrier layer 250 includes tantalum nitride, titanium nitride, manganese nitride, other suitable materials, or combinations thereof. The barrier layer 250 may be formed by any suitable deposition method such as ALD, PVD, CVD, other suitable methods, or combinations thereof, to a thickness of about 5 Angstroms to 35 Angstroms. Of course, the present disclosure is not limited to such dimensions so long as a thickness of the barrier layer 250 permits sufficient processing window for subsequently formed material layer(s) in the openings 240 and 242. In some embodiments, forming the barrier layer 250 is optional.

Figure 11:
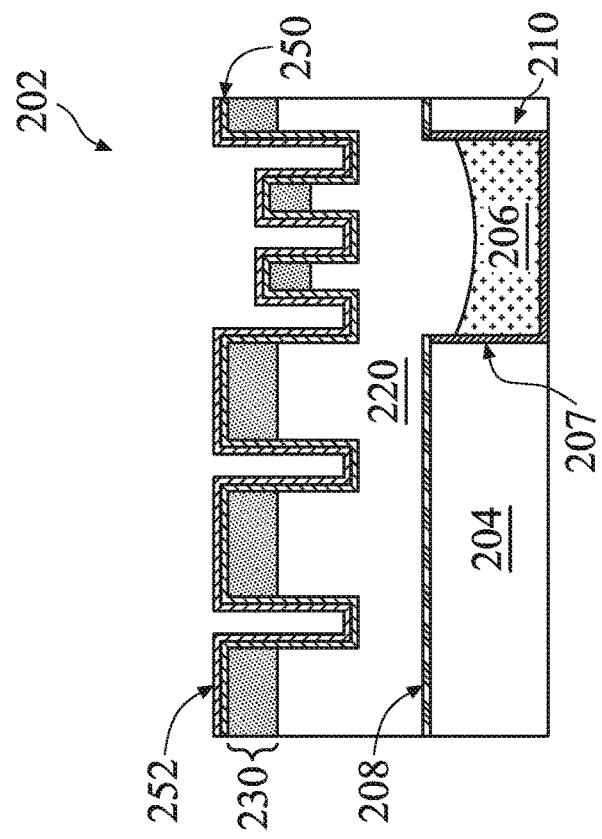

Referring to FIG. 11, the method 100 forms an adhesive layer 252 over the barrier layer 250. In some embodiments, the adhesive layer 252 is conformably formed over the barrier layer 250. In many embodiments, the adhesive layer 252 is configured to facilitate the bonding between the barrier layer and the subsequently formed conductive layer (i.e., a bulk conductive layer 254). The adhesive layer 252 may include any suitable conductive material such as ruthenium (Ru), iridium (Ir), rhodium (Rh), platinum (Pt), cobalt (Co), manganese (Mn), titanium (Ti), other suitable conductive materials, or combinations thereof. The adhesive layer 252 may be deposited using any suitable method such as, PVD, CVD, ALD, other suitable methods, or combinations thereof, to a thickness of about 5 Angstroms to about 35 Angstroms. Of course, the present disclosure is not limited to such dimensions so long as a thickness of the adhesive layer 252 (and the barrier layer 250 if present) permits sufficient processing window for subsequently formed material layer(s) in the openings 240 and 242.

Figures 12, 13:
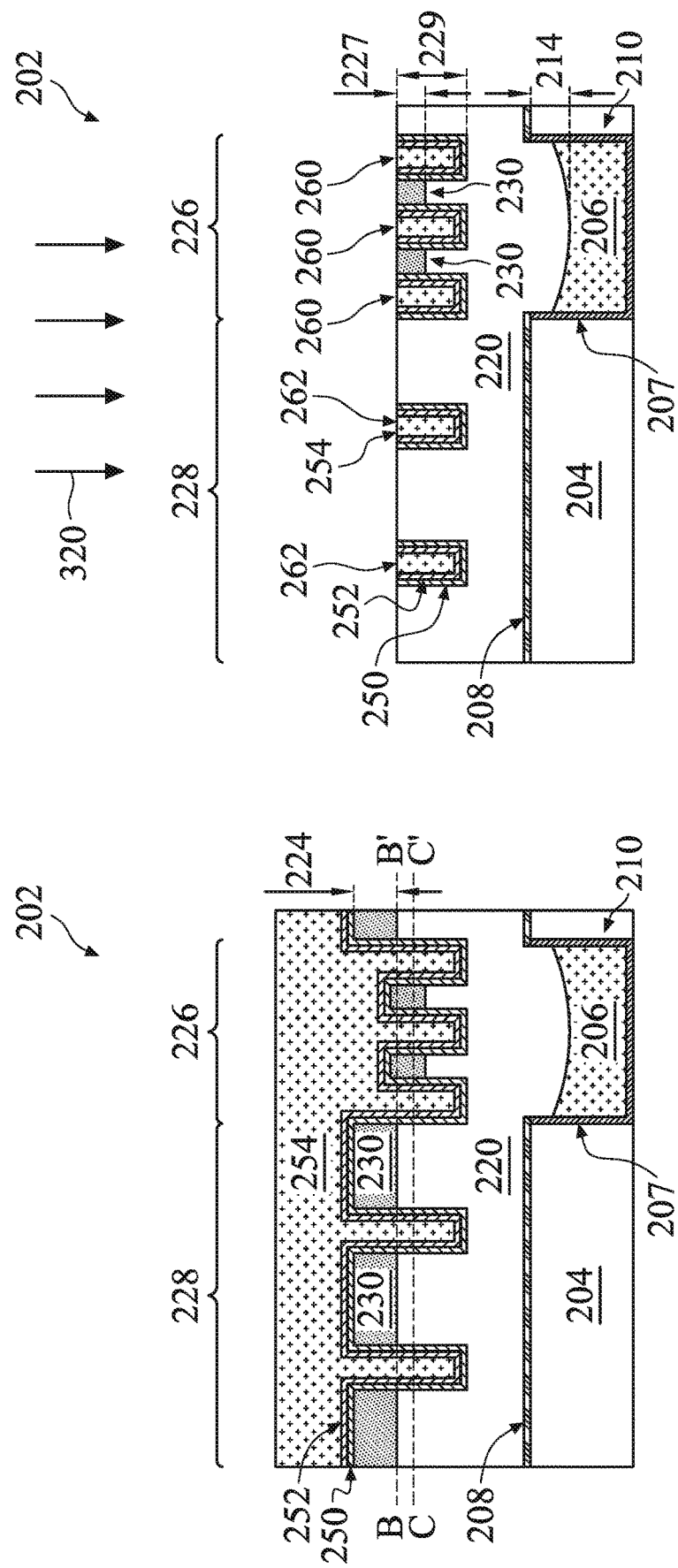

Referring to FIG. 12, the method 100 then forms the bulk conductive layer 254 over the adhesive layer 252, thereby filling the openings 240 and 242 in the regions 226 and 228, respectively. As depicted herein, portions of the bulk conductive layer 254 are formed over a top surface of the dielectric layer 230. In many embodiments, the bulk conductive layer 254 includes copper (Cu), Ru, molybdenum (Mo), aluminum (Al), Co, nickel (Ni), Mn, silver (Ag), other suitable metals, or combinations thereof. The bulk conductive layer 254 may be formed by any suitable deposition method such as CVD, ALD, plating, other suitable methods, or combinations thereof. In some embodiments, the adhesive layer 252 and the bulk conductive layer 254 include the same metal. For example, both the adhesive layer 252 and the bulk conductive layer 254 include Co. In some embodiments, the adhesive layer 252 and the bulk conductive layer 254 include different metal(s). In the present embodiments, the adhesive layer 252 includes a metal more noble (i.e., having a more positive, or higher, galvanic potential and thus less likely to be oxidized) than a metal included in the bulk conductive layer 254. In one example, the adhesive layer 252 may include Ti (more noble) and the bulk conductive layer 254 may include Cu (less noble). In another example, the adhesive layer 252 may include Pt (more nobel) and the bulk conductive layer 254 may include Co (less noble). Of course, the present disclosure is not limited to such examples and other combinations of metals may also be applicable for the adhesive layer 252 and the bulk conductive layer 254.

Subsequently, referring to FIG. 13, the method 100 at block 114 performs a CMP process 320 to form conductive features 260 and 262 in the regions 226 and 228, respectively. As discussed above, the top surface of the portion of the dielectric layer 230 in the region 226 is disposed below the top surface of the portion of the dielectric layer 230 in the region 228. As such, when the method 100 applies the CMP process 320, portions of the dielectric layer 230 disposed in the region 228 are completely removed, while portions of the dielectric layer 230 disposed in the region 226 remain over the ILD layer 220. In the depicted embodiments, the CMP process 320 is implemented along the line BB'. As such, the CMP process 320 removes at least a thickness substantially equivalent to the depth 224 (i.e., the depth 214) as depicted herein. In some embodiments, the CMP process 320 is implemented along the line CC', i.e., below the line BB', such that a portion of the ILD layer 220 is removed with the portions of the dielectric layer 230 in the region 228. In other words, in the present embodiments, the CMP process 320 completely removes the portions of the dielectric layer 230 from the region 228.

In the present embodiments, still referring to FIG. 13, a bottom surface of the dielectric layer 230 in the region 226 is above a bottom surface of the conductive feature 260. In some embodiments, a ratio of the thickness 227 of the remaining portions of the dielectric layer 230 in the region 226 to a height 229 of the conductive feature 260 is about 1:400 to about 1:2. In some examples, the height 229 is about 100 Angstroms to about 800 Angstroms, while the thickness 227 is about 2 Angstroms to about 50 Angstroms. Notably, if such ratio is greater than about 1:2, capacitance of the resulting device 200 may be too high, thus compromising performance of the device 200. On the other hand, if such ratio is smaller than about 1:400, insufficient amount of dielectric layer 230 may not mitigate the entrapment of metal ions produced by redox reactions between the adhesive layer 252 and the bulk conductive layer 254 (discussed in detail below).

In some embodiments, the CMP process 320 utilizes a different slurry from that used in the CMP processes 310A and/or 310B in order to control the removal rates and selectivity of the ILD layer 220, the bulk conductive layer 254, the adhesive layer 252, the barrier layer 250, and/or the dielectric layer 230. In some embodiments, the CMP process 320 implements a slurry that includes chemical agents configured to suppress the removal of the ILD layer 220 as well as metals in the conductive layer 254, the adhesive layer 252, and/or the barrier layer 250. For example, the CMP process 320 may implement a slurry that includes polyethylene glycol (and/or derivatives thereof) to suppress the removal rate of the ILD layer 220 and an amine to protect metal(s) in the barrier layer 250, the adhesive layer 252, and/or the bulk conductive layer 254 from corrosion. As a result, the slurry implemented for the CMP process 320 may be more basic (i.e., having a pH value of greater than about 7 to about 11) than the slurry implemented for the CMP process 310A. In some embodiments, the slurry implemented for the CMP process 320 is free or substantially free of any organic acid configured to enhance the removal of metals in the conductive layer 254, the adhesive layer 252, and/or the barrier layer 250. In addition, the removal rates and selectivity of the CMP process 320 may be controlled by the sizes of the abrasive particles included in the CMP slurry. In the present embodiments, to control the CMP process 320 such that the polishing stops when portions of the dielectric layer 230 are removed from the region 228, the abrasive particles have sizes of about 40 nm to about 120 nm in diameter.

Figure 14:
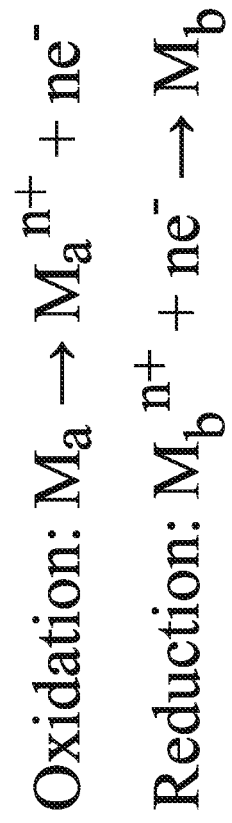
FIG. 14 illustrates example embodiments of chemical reactions occurring during an intermediate step of the method of FIG. 1 according to one or more aspect of the present disclosure.

Notably, portions of the dielectric layer 230 remaining in the region 226 are disposed between adjacent conductive features 260 and near the surface region of the device 200. As discussed above, a CMP process generally employs a slurry that includes an oxidant configured to promote the removal of portions of a structure. In the present embodiments, the adhesive layer 252 and the bulk conductive layer 254 may include metals with different values of galvanic potential such that one of the adhesive layer 252 and the bulk conductive layer 254 is more likely to undergo an oxidation reaction while the other one is more likely to undergo a reduction reaction. FIG. 14 illustrates example reduction-oxidation (redox) reactions between metals included in the adhesive layer 252 and the bulk conductive layer 254 in the surface region where the CMP process is implemented. In the depicted embodiment, "$M_a$" denotes a more active metal (i.e., a metal having a lower galvanic potential) included in the bulk conductive layer 254, "Mb" denotes a more noble metal (i.e., a metal having a higher galvanic potential) included in the adhesive layer 252, and "n" denotes a number of electrons being transferred between a given pair of metals during the redox reactions. Of course, the present disclosure is also applicable if the more active metal is included in the adhesive layer 252 and a more noble metal is included in the bulk conductive layer 254. Accordingly, as metal(s) in the bulk conductive layer 254 are oxidized by the oxidant in the slurry, electrons and metal ions are generated as a result. For conductive features that are sparse in density, e.g., the conductive features 262 disposed in the region 228, products of such redox reactions are substantially confined within or near the vicinity of the conductive features and eventually reaches reaction equilibrium. However, for conductive features that are more densely packed, e.g., the conductive features 260 disposed in the region 226, free metal ions of the oxidation reactions could penetrate into the surrounding porous dielectric layer (e.g., the ILD layer 220) and become trapped therein. The trapped metal ions, which are larger and thus less mobile than electrons, may accumulate and may lead to time-dependent dielectric breakdown (TDDB) and/or voltage breakdown (VBD), thus compromising performance of the device over time.

To remedy such effects, embodiments of the present disclosure provide methods of selectively forming the dielectric layer 230 between the more densely packed conductive features 260 via a series of CMP processes. In the present embodiments, the dielectric layer 230 has a higher density than the surrounding ILD layer (e.g., the ILD layer 220), which is porous and more prone to trapping metal ions therein. Notably, by forming the dishing profile 212 in the conductive feature 210 and subsequently transferring such profile to the ILD layer 220, the method 100 as depicted herein provides an uneven topography with the dielectric layer 230 formed at its surface. The subsequent CMP process 320 selectively removes portions of the dielectric layer 230 disposed between the relatively more sparsely packed conductive features 262, leaving behind portions of the dielectric layer 230 disposed between the more densely packed conductive features 260. In many embodiments, the remaining portions of the dielectric layer 230 between the conductive features 260 inhibit the metal ions from being released from the conductive features 260 and subsequently entrapped between neighboring conductive features 260 during a CMP process, effectively reducing occurrence of reliability issues such as TDDB and/or VBD.

The method 100 then proceeds to block 116 where additional processing steps may be performed. For example, subsequent processing may form various contacts, vias, conductive lines, and other multilayers interconnect features (e.g., metal layers and ILD layers) over the structure 202, configured to connect the various features to form a functional circuit that may include one or more FET devices. In some embodiments, a dual damascene process may be used to form one or more of the multilayer interconnection features, followed by one or more CMP process to planarize a top surface of the resulting device.

According to various aspects of the present disclosure, methods of performing a series of CMP processes are provided. In some embodiments, a CMP process is implemented to polish conductive features (e.g., device-level contacts, interconnect structures, etc.) disposed in a low-density dielectric layer (e.g., an ILD layer containing a low-k dielectric material). In some embodiments, the conductive features are disposed in two adjacent regions, in which one of the region includes densely packed conductive features and the other region includes sparsely packed conductive features. Because dissimilar metals included in the conductive features (particularly the densely packed conductive features) experience redox reactions caused by the application of an oxidizer during a CMP process, charges (i.e., metal ions) produced by the redox reactions may be inadvertently accumulated in the low-density dielectric layer, compromising the reliability of the resulting device. The present disclosure provides a high-density dielectric layer selectively formed between the densely packed conductive features and configured to prevent entrapment of metal ions during the CMP process. In some embodiments, the present disclosure provides methods of selectively removing at least portions of the high-density dielectric layer from between the sparsely packed conductive features by performing a CMP process to introduce uneven topography across the two regions, such that the region with the densely packed conductive features has a top surface lower than the region with the sparsely packed conductive features. Subsequently, when a CMP process is applied across the regions, portions of the high-density dielectric layer are removed from the sparsely packed region but left in the densely packed region.

While a few advantages of certain embodiments described herein have been described, other advantages of using one or more of the present embodiments may be present and no particular advantage is required for the embodiments described in the present disclosure. In one example, the methods provided herein allow fabrication and planarization of conductive features of different sizes and packing densities to be performed at the same time, thereby reducing the cost and complexity associated with device production. In another example, methods provided herein are configured to prevent entrapment and accumulation of unwanted charge carriers between adjacent conductive features, lowering the occurrence of potential reliability issues such as TDDB and/or VBD.

In one aspect, the present disclosure provides a method that includes removing a top portion of a conductive feature disposed in a first dielectric layer and over a semiconductor substrate to form a first recess, depositing a second dielectric layer over the first dielectric layer, where the second dielectric layer includes a first region disposed vertically above the first recess and a second region disposed adjacent the first region, and subsequently forming a third dielectric layer over the second dielectric layer. The method further includes forming openings in the third dielectric layer that extend to expose the second dielectric layer, depositing a conductive material in the openings, and planarizing the conductive material to form conductive features in the first and the second regions, where the planarizing completely removes portions of the third dielectric layer disposed in the second region.

In another aspect, the present disclosure provides a method that includes performing a first CMP process to a first conductive feature disposed in a first ILD layer, resulting a recess in the first conductive feature, where the first CMP process is implemented using a first slurry, and forming a second ILD layer over the first ILD layer, wherein the second ILD layer includes a first region disposed above the recess and a second region disposed adjacent the first region. The method further includes depositing a dielectric layer over the second ILD layer, where a top surface of a first portion of the dielectric layer disposed in the first region is below a top surface of a second portion of the dielectric layer disposed in the second region, and subsequently forming conductive features over the first ILD layer. In particular, forming the conductive features includes forming openings in the first and the second regions, depositing at least one conductive material in the openings, and performing a second CMP process to expose the first portion of the dielectric layer, where the second CMP process is implemented using a second slurry different from the first slurry.

In yet another aspect, the present disclosure provides a semiconductor structure that includes a first conductive feature disposed in a first interlayer dielectric (ILD) layer, where a top surface of the first conductive feature includes a dishing profile, and a second ILD layer disposed over the first ILD layer, where the second ILD layer includes a first region disposed vertically above the first conductive feature and a second region disposed adjacent the first region, and where the dishing profile laterally spans at least a width of the first region. The semiconductor structure further includes second conductive features disposed in the first region and separated by a first distance, a dielectric layer embedded in the second ILD layer and disposed between the second conductive features in the first region, where the second region is free of the dielectric layer, and third conductive features disposed in the second region and separated by a second distance, where the second distance is greater than the first distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
forming a conductive feature in a first dielectric layer and over a semiconductor substrate;
removing a top portion of the conductive feature to form a first recess;

depositing a second dielectric layer over the first dielectric layer, wherein the second dielectric layer includes a first region disposed vertically above the first recess and a second region disposed adjacent to the first region;

forming a third dielectric layer over the second dielectric layer;

forming openings in the third dielectric layer that extend to expose the second dielectric layer;

depositing a conductive material in the openings; and planarizing the conductive material to form conductive features in the first and the second regions, wherein the planarizing completely removes the third dielectric layer disposed in the second region.

2. The method of claim 1, wherein removing the top portion of the conductive feature and planarizing the conductive material each include performing a chemical-mechanical polishing (CMP) process.

3. The method of claim 2, wherein removing the top portion of the conductive feature and planarizing the conductive material are implemented with different CMP slurries.

4. The method of claim 1, wherein removing the top portion of the conductive feature includes removing portions of a barrier layer disposed over the first dielectric layer.

5. The method of claim 1, wherein depositing the conductive material includes:
 depositing a metal liner in the openings; and
 forming a bulk metal layer over the metal liner such that portions of the bulk metal layer are formed over a top surface of the third dielectric layer.

6. The method of claim 5, wherein the metal liner and the bulk metal layer include metals having different galvanic potentials.

7. The method of claim 1, wherein planarizing the conductive material leaves a portion of the third dielectric layer in the first region.

8. The method of claim 1, wherein forming the openings includes forming openings having a first density in the first region and forming openings having a second density in the second region, and wherein the first density is greater than the second density.

9. A method, comprising:
 forming a first conductive feature in a first interlayer-dielectric (ILD) layer;
 performing a first chemical-mechanical polishing (CMP) process to the first conductive feature, resulting a recess in the first conductive feature, wherein the first CMP process is implemented using a first slurry;
 forming a second ILD layer over the first ILD layer, wherein the second ILD layer includes a first region disposed above the recess and a second region disposed adjacent to the first region;
 depositing a dielectric layer over the second ILD layer, wherein a top surface of a first portion of the dielectric layer disposed in the first region is below a top surface of a second portion of the dielectric layer disposed in the second region; and
 forming conductive features in the second ILD layer, wherein forming the conductive features includes:
  forming openings in the dielectric layer over the first and the second regions;
  depositing at least one conductive material in the openings; and
  performing a second CMP process to expose the first portion of the dielectric layer, wherein the second CMP process is implemented using a second slurry different from the first slurry.

10. The method of claim 9, wherein the first ILD layer includes a barrier layer disposed thereon, the method further comprising performing a third CMP process before performing the first CMP process, wherein the third CMP process removes portions of the barrier layer disposed on the first ILD layer.

11. The method of claim 9, wherein pH of the second slurry is greater than pH of the first slurry.

12. The method of claim 9, wherein depositing the at least one conductive material includes depositing a liner material in the openings and depositing a bulk material over the liner material.

13. The method of claim 9, wherein forming the conductive features further includes forming a barrier layer in the openings before depositing the at least one conductive material, the barrier layer including tantalum nitride, titanium nitride, manganese nitride, or combinations thereof.

14. A method, comprising:
 forming a first conductive layer in a first interlayer dielectric (ILD) layer;
 performing a first chemical-mechanical polishing (CMP) process to the first conductive layer, thereby forming a first conductive feature, wherein a top surface of the first conductive feature is defined by a dishing profile such that it is below a top surface of the first ILD layer;
 depositing a second ILD layer over the first ILD layer;
 depositing a dielectric layer over the second ILD layer, wherein the dielectric layer differs from the first and the second ILD layers in composition;
 patterning the dielectric layer and the second ILD layer to form openings, wherein the openings partially penetrate the second ILD layer;
 forming a second conductive layer in the openings; and
 performing a second CMP process to the second conductive layer, thereby forming second conductive features directly above the first conductive feature, wherein performing the second CMP process results in portions of the dielectric layer remaining in a first region directly above the first conductive feature and portions of the dielectric layer completely removed in a second region adjacent to the first region.

15. The method of claim 14, wherein porosity of the dielectric layer is greater than that of the first and the second ILD layers.

16. The method of claim 14, wherein performing the first and the second CMP processes implement slurries of different compositions.

17. The method of claim 16, wherein performing the first CMP process implements a first slurry with a first pH and performing the second CMP process implements a second slurry with a second pH, and wherein the second pH is greater than the first pH.

18. The method of claim 14, wherein the remaining portions of the dielectric layer are embedded between the second conductive features.

19. The method of claim 14, wherein forming the second conductive layer includes:
 depositing a metal liner in the openings; and
 forming a bulk metal layer over the metal liner, wherein performing the second CMP process removes portions of the metal liner and portions of the bulk metal layer formed over a top surface of the dielectric layer.

20. The method of claim 19, wherein the metal liner and the bulk metal layer include metals having different galvanic potentials.

\* \* \* \* \*